United States Patent
Hashemi et al.

(10) Patent No.: US 11,778,921 B2
(45) Date of Patent: Oct. 3, 2023

(54) DOUBLE MAGNETIC TUNNEL JUNCTION DEVICE

(71) Applicant: International Business Machines Corporation, Armonk, NY (US)

(72) Inventors: Pouya Hashemi, Purchase, NY (US); Bruce B. Doris, Slingerlands, NY (US); Chandrasekharan Kothandaraman, New York, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 17/128,330

(22) Filed: Dec. 21, 2020

(65) Prior Publication Data

US 2022/0199898 A1    Jun. 23, 2022

(51) Int. Cl.
  *H01F 10/32* (2006.01)
  *H10N 50/10* (2023.01)
  (Continued)

(52) U.S. Cl.
  CPC ......... *H10N 50/10* (2023.02); *H01F 10/3254* (2013.01); *H10N 50/01* (2023.02); *H10N 50/80* (2023.02); *H10N 50/85* (2023.02)

(58) Field of Classification Search
  CPC ......... H01L 43/08; H01L 43/02; H01L 43/10; H01L 43/12; H01L 27/20; H01F 10/3254; G01R 15/205
  See application file for complete search history.

(56) References Cited

U.S. PATENT DOCUMENTS

| 7,948,044 B2 | 5/2011 | Horng et al. |
| 8,796,042 B2 | 8/2014 | Shin et al. |

(Continued)

FOREIGN PATENT DOCUMENTS

| CN | 104134748 A | * 11/2014 | ............ H01L 43/08 |
| CN | 104134748 A | 11/2014 | |

(Continued)

OTHER PUBLICATIONS

Yoshida et al., "Reliability enhancement due to in-situ post-oxidation of sputtered MgO barrier in double MgO barrier magnetic tunnel junction", AIP Advances 7, 065105 (2017), https://doi.org/10.1063/1.4985300, Submitted: Mar. 18, 2017, Accepted: May 29, 2017, Published Online: Jun. 5, 2017, 7 pages. https://doi.org/10.1063/1.4985300.

(Continued)

*Primary Examiner* — William C Trapanese
(74) *Attorney, Agent, or Firm* — Jeffrey M. Ingalls

(57) ABSTRACT

A method of manufacturing a double magnetic tunnel junction device is provided. The method includes forming a first magnetic tunnel junction stack, forming a spin conducting layer on the first magnetic tunnel junction stack, forming a second magnetic tunnel junction stack on the spin conducting layer, and forming a dielectric spacer layer on surfaces of the spin conducting layer and the second magnetic tunnel junction stack. The second magnetic tunnel junction stack has a width that is less than a width of the first magnetic tunnel junction stack. Also, a width of the spin conducting layer increases in a thickness direction from a first side of the spin conducting layer adjacent to the second magnetic tunnel junction stack to a second side of the spin conducting layer adjacent to the first magnetic tunnel junction stack.

20 Claims, 12 Drawing Sheets

(51) Int. Cl.
  *H10N 50/01* (2023.01)
  *H10N 50/80* (2023.01)
  *H10N 50/85* (2023.01)

(56) References Cited

U.S. PATENT DOCUMENTS

| | | | |
|---|---|---|---|
| 9,028,910 B2 | 5/2015 | Zhou et al. | |
| 9,564,577 B1* | 2/2017 | Hsu | H10N 50/10 |
| 10,153,427 B1 | 12/2018 | Shen et al. | |
| 2007/0063236 A1 | 3/2007 | Huai | |
| 2010/0053823 A1* | 3/2010 | Iwayama | H01L 43/12 |
| 2017/0033282 A1 | 2/2017 | Wang et al. | |
| 2017/0194559 A1 | 7/2017 | Huang et al. | |
| 2017/0294482 A1 | 10/2017 | Hu | |
| 2019/0259810 A1 | 8/2019 | Jacob et al. | |
| 2019/0288183 A1* | 9/2019 | Kanaya | H01F 10/3286 |
| 2019/0334080 A1* | 10/2019 | Ahmed | H01L 43/08 |
| 2020/0176041 A1* | 6/2020 | Shen | H01L 27/222 |
| 2020/0185016 A1* | 6/2020 | Sakhare | H01L 43/02 |
| 2020/0365308 A1* | 11/2020 | Lin | H01L 43/10 |

FOREIGN PATENT DOCUMENTS

| | | | | |
|---|---|---|---|---|
| CN | 105374936 A | * | 3/2016 | G11C 11/161 |
| CN | 105374936 A | | 3/2016 | |
| CN | 107623069 A | | 1/2018 | |

OTHER PUBLICATIONS

International Search Report and Written Opinion for Application PCT/CN2021/131209, dated Feb. 11, 2022, 9 pages.

* cited by examiner

DOUBLE MAGNETIC TUNNEL JUNCTION DEVICE

BACKGROUND

The present disclosure relates to magnetic tunnel junction ("MTJ") devices and methods of manufacturing MTJ devices. The tunnel magnetoresistance ("TMR") and the write efficiency are factors that affect the performance of DMTJs.

SUMMARY

Embodiments of the present disclosure relate to a method of manufacturing a wide base double magnetic tunnel junction device. The method includes forming a first magnetic tunnel junction stack, forming a spin conducting layer on the first magnetic tunnel junction stack, forming a second magnetic tunnel junction stack on the spin conducting layer, and forming a dielectric spacer layer on surfaces of the spin conducting layer and the second magnetic tunnel junction stack. The second magnetic tunnel junction stack has a width that is less than a width of the first magnetic tunnel junction stack. Also, a width of the spin conducting layer increases in a thickness direction from a first side of the spin conducting layer adjacent to the second magnetic tunnel junction stack to a second side of the spin conducting layer adjacent to the first magnetic tunnel junction stack.

Other embodiments relate to a double magnetic tunnel junction device. A double magnetic tunnel junction device includes a first magnetic tunnel junction stack, a spin conducting layer formed on the first magnetic tunnel junction stack, a second magnetic tunnel junction stack formed on the spin conducting layer, and a dielectric spacer formed on surfaces of the spin conducting layer and the second magnetic tunnel junction stack. The second magnetic tunnel junction stack has a width that is less than a width of the first magnetic tunnel junction stack. A width of the spin conducting layer increases in a thickness direction from a first side of the spin conducting layer adjacent to the second magnetic tunnel junction stack to a second side of the spin conducting layer adjacent to the first magnetic tunnel junction stack.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
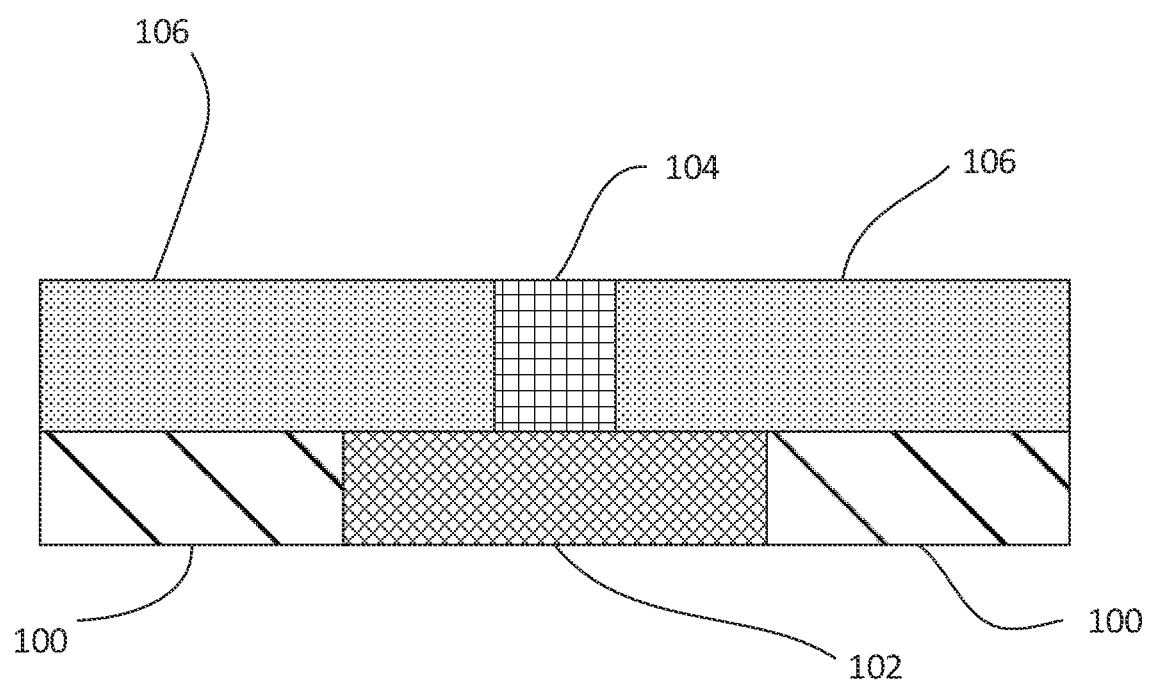
FIG. 1 is a cross-sectional view of certain base layers that are formed underneath a wide base double magnetic tunnel junction device, according to embodiments.

The present disclosure describes double magnetic tunnel junction ("DMTJ") devices and methods of manufacturing DMTJ devices. In particular, the present disclosure describes a wide non-magnetic base modified DMJT tunnel barrier structure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (~5 ns) are with double magnetic tunnel junctions ("DMTJ"). DMTJ devices reduce the write current by factor of two.

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide based devices provide double spin-current sourcing ("DSTT") benefits. Also, for these types of devices, the bottom barrier layer can have a relatively high RA. These devices leverage spin-diffusion transport in the non-magnetic ("NM") metal layer and can a achieve a reduction in the charge current density through the bottom MgO layer. The bottom NM layer may also serve as an additional boron drain conduit during the annealing processes. In certain of these devices, a non-magnetic spin conductor is used between the two MTJ stacks (e.g., Cu, CuN, Ag, AgSn etc.). During the manufacture of these devices, an in-situ stack deposition process is desired for stack integrity and to avoid an unexpected loss of spin conductance which may happen in an ex-situ process such as oxidation or CMP. However, with these wide based DMTJ devices, there is a need to harness a stop-etch on a, for example, Ag type of NM layer. There is also a need to control the body-centered cubic (e.g., CoFe) nucleation front.

The present embodiments include DMJT structures and methods of fabricating DMTJ structures where one of the MTJ stacks has a wider base than the other. In certain of these embodiments, the DMTJ stack is deposited once on top of the via (no ex-situ break). In certain embodiments, a sidewall spacer is formed after patterning the top junction by RIE or IBE, followed by formation of a second junction and then encapsulation. In certain embodiments, the methods of manufacturing a DMTJ are compatible with methods of forming single MTJ devices (with slight variations).

The flowcharts and cross-sectional diagrams in the Figures illustrate methods of manufacturing DMTJs according to various embodiments. In some alternative implementations, the manufacturing steps in the flowcharts may occur in a different order that that which is noted in the Figures. Moreover, any of the layers depicted in the Figures may contain multiple sublayers.

Referring now to the drawings in which like numerals represent the same or similar elements and initially to FIG. 1, an exemplary method of manufacturing a DMTJ stack to which the present embodiments may be applied is shown. Several back end of line ("BEOL") layers are formed. In general, the back end of line (BEOL) is the second portion of IC fabrication where the individual devices (transistors, capacitors, resistors, etc.) are interconnected with wiring on the wafer. As shown in FIG. 1, a first BEOL layer includes a BEOL metal layer 102 and a BEOL dielectric layer 100. The BEOL metal layer 102 can include, for example, Cu, TaN, Ta, Ti, TiN or a combination thereof. A BEOL dielectric layer 100 is formed on the sides of the metal layer 102. The BEOL dielectric layer 100 may be composed of, for example, $SiO_x$, $SiN_x$, SiBCN, low-κ, NBLOK, or any other suitable dielectric material.

Another BEOL layer is formed on the BEOL metal layer 102 and the BEOL dielectric layer 100. In particular, a via fill layer 104 is formed on the metal layer 102, and a via dielectric layer 106 is formed on the sides of the via fill layer 104. Initially, the via dielectric layer 106 may be formed by patterning via lithography. Then, a via is formed in the via dielectric layer 106 by, for example, RIE to remove a space for subsequent filling with the via fill layer 104. In certain embodiments, the via fill layer 104 may include a material such as W, Cu, TaN, Ta, Ti, TiN, TiOCN, TaOCN, or a combination of these materials. The via fill layer 104 can be formed by CVD, PVD, ALD or a combination thereof. After the via fill layer 104 is formed, the structure is subjected to, for example, CMP to planarize the surface for further processing. The structure including the BEOL layers shown in FIG. 1 is a starting structure upon which the MTJ stacks are to be formed.

Figure 2:
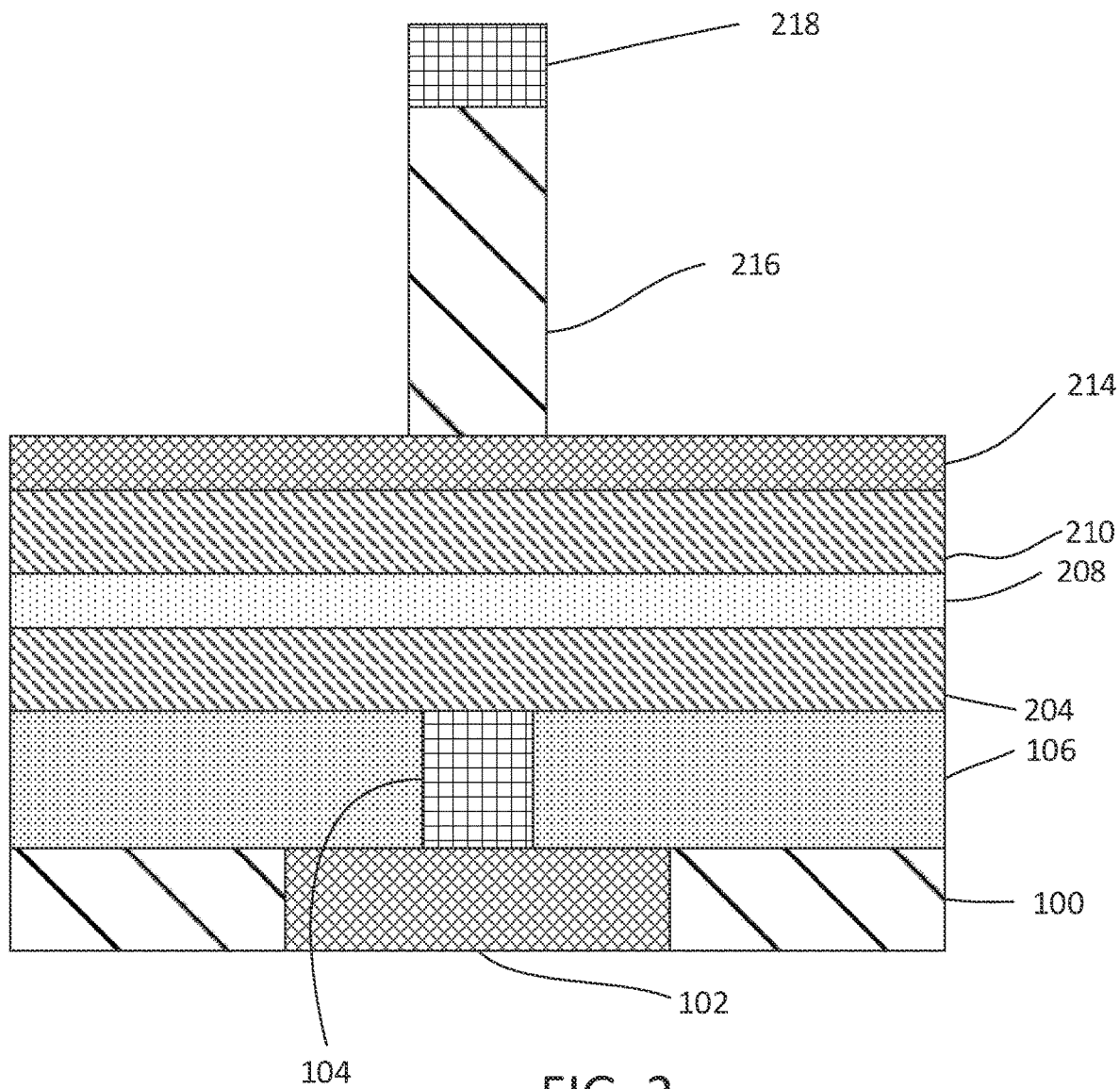
FIG. 2 depicts a cross-sectional view of the double magnetic tunnel junction device of FIG. 1 after additional fabrication operations, according to embodiments.

Referring now to FIG. 2, a first MTJ stack 204 is formed, followed by a spin-conducting layer 208, followed by a second MTJ stack 210. For the sake of simplicity and ease of understanding, not all of the layers of the MTJ stacks are shown in the figures. In certain embodiments, the MTJ stacks 204 and 210 each include a reference layer, a first tunnel barrier layer, a first free layer, a metal spacer layer, a second free layer, and a second tunnel barrier layer. It should be appreciated that the MTJ stack may include additional layers, omit certain layers, and each of the layers may include sublayers.

In general, with regard to the MTJ stacks, information is stored in the magnetic orientation of a free layer film (described in further detail herein) in relation to that of the reference layer. The reference layer may be a single layer or a plurality of layers. In an embodiment, the reference layer of the MTJ stack is a synthetic antiferromagnetic ("SAF") layer. In certain embodiments, the reference layer of the MTJ stack includes a plurality of sublayers (e.g., twenty or more sublayers).

In formation of either of the MTJ stacks, a first tunnel barrier layer is formed on top of the reference layer. In an embodiment, the first tunnel barrier layer is a barrier, such as a thin insulating layer or electric potential, between two electrically conducting materials. Electrons (or quasiparticles) pass through the tunnel barrier by the process of quantum tunneling. In certain embodiments, the first tunnel barrier layer includes at least one sublayer composed of MgO. It should be appreciated that materials other than MgO can be used to form the first tunnel barrier layer. The free layer is a magnetic free layer that is adjacent to the first tunnel barrier layer so as to be opposite the reference layer. The magnetic free layer has a magnetic moment or magnetization that can be flipped. The second tunnel barrier layer is formed on the free layer. In certain embodiments, the second tunnel barrier includes an outermost sublayer (or some other sublayer) comprised of the same material (e.g., MgO) as the first tunnel barrier layer. It should also be appreciated that either of the MTJ stacks 204 and 210 may include additional layers, omit certain layers, and each of the layers may include any number of sublayers. Moreover, the composition of layers and/or sublayers may be different between the first MTJ stack 204 and the second MTJ stack 210. In certain embodiments, the first MTJ stack 204 and the second MTJ stack 210 are formed by a self-aligned patterning process. However, in certain examples, the first MTJ stack 204 is not self-aligned with the second MTJ stack 210.

Referring again to FIG. 2, an etch stop layer 214 is formed on the second MTJ stack 210. The etch stop layer 214 can be composed of, for example, Ru. In certain embodiments, a cap layer (not shown) is formed between the second MTJ stack 210 and the etch stop layer 214. A metallic hard mask layer 216 is formed on the etch stop layer 214. The metallic hard mask layer 216 may be composed of, for example, W, TaN or TiN. Also, a dielectric and/or organic hard mask layer 218 is formed on the metallic hard mask layer 216. The organic hard mask layer 218 may be composed of, for example, an organic planarization layer ("OPL") material, $SiN_x$, $SiO_x$ or photoresist. The metallic hard mask layer 216 and the organic hard mask layer 218 may be patterned by lithography and RIE.

Figure 3:
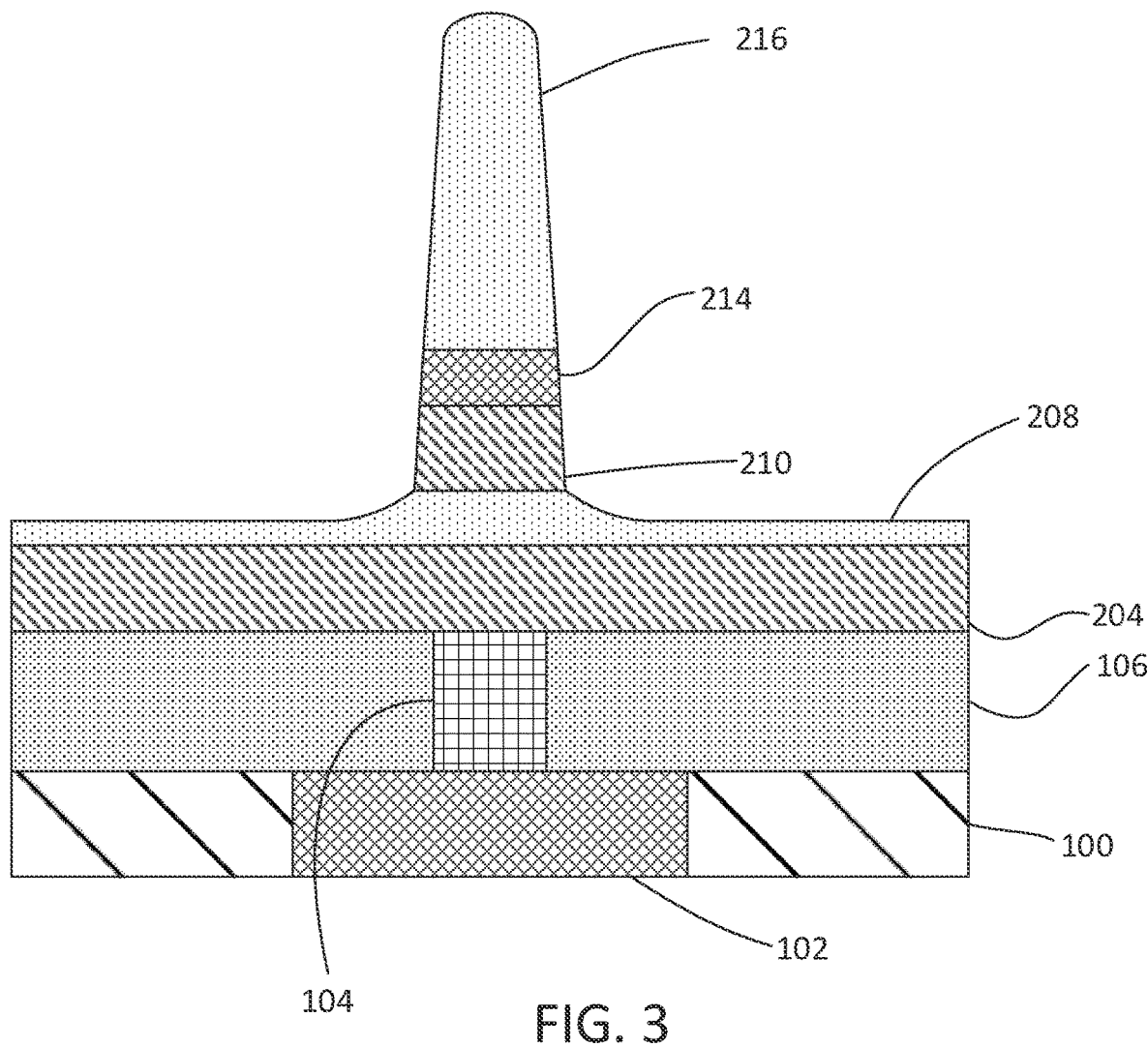
FIG. 3 depicts a cross-sectional view of the double magnetic tunnel junction device of FIG. 2 after additional fabrication operations, according to embodiments.

As shown in FIG. 3, the second MTJ stack 210 is patterned by IBE or RIE (or some combination of same). This etching process is stopped inside (near the top) of the spin conducting layer 208. As shown in FIG. 3, the etched spin conducting layer 208 has a curved cross-sectional profile near where the spin conducting layer 208 meets the second MTJ stack 210. At this stage in the manufacturing process, the critical dimension (CD) of the second MTJ stack 210 is less than that of the first MTJ stack 204. Moreover, the CD of the spin conducting layer 210 gradually changes throughout the thickness of the layer. In certain embodiments, an air-break or controlled in-situ oxidation may be utilized to reduce partial electrical shorts. FIG. 3 shows that the final shape of the combination of the metallic hard mask layer 216, the etch stop layer 214 and the second MTJ stack 210 has a tapered shape with a fairly consistent slope (i.e., at least substantially until you reach the spin conducting layer 208 where the CD gradually increases by the curved portion thereof). However, it should be appreciated that in other embodiments, the sidewalls of the of the combination of the metallic hard mask layer 216, the etch stop layer 214 and the second MTJ stack 210 have a vertical (or nearly vertical) profile.

Figure 4:
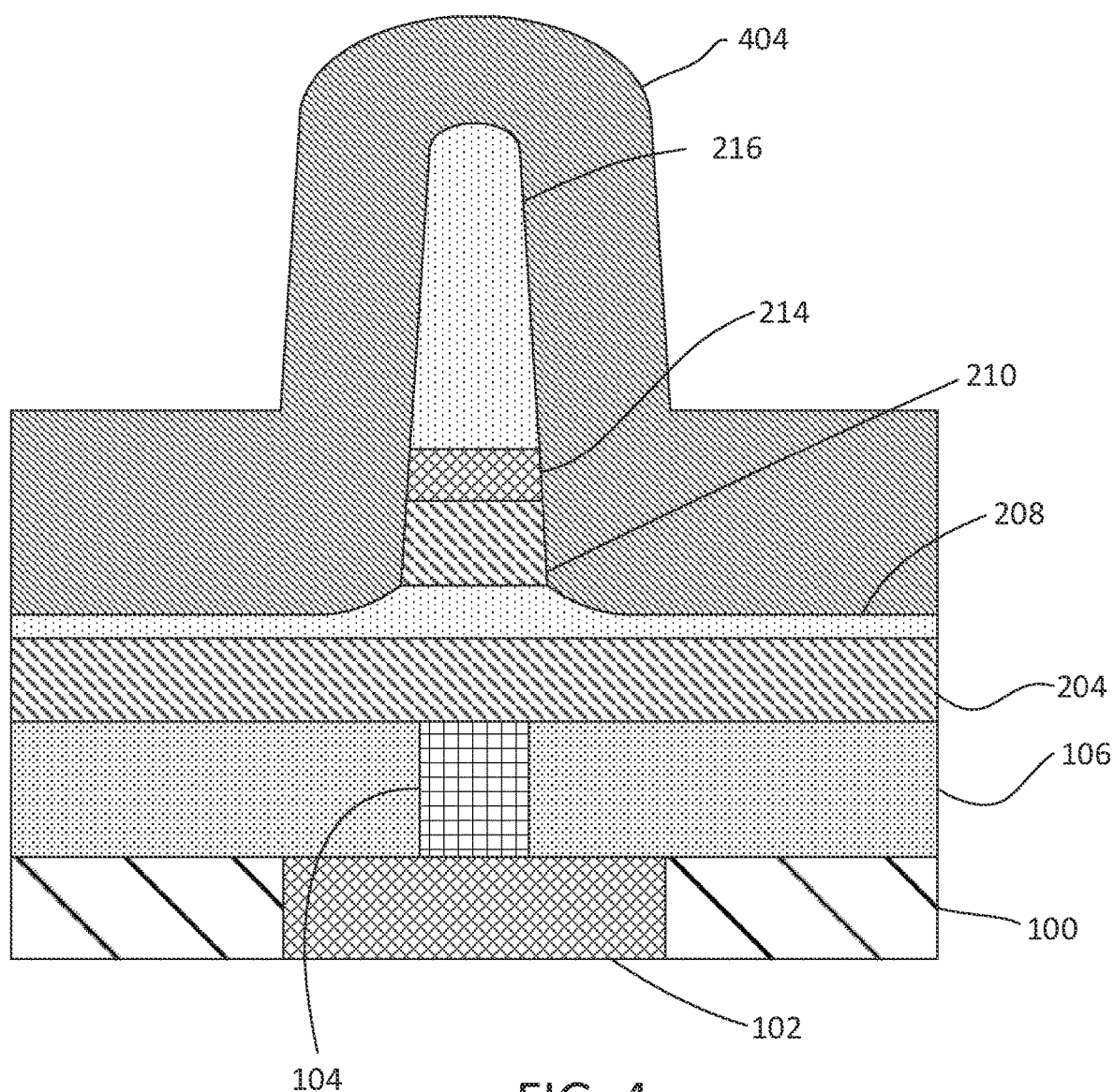
FIG. 4 depicts a cross-sectional view of the double magnetic tunnel junction device of FIG. 3 after additional fabrication operations, according to embodiments.

Referring now to FIG. 4, a sidewall dielectric spacer layer 404 is formed on the DMTJ structure by PVD, ALD or PECVD. The sidewall dielectric spacer layer 404 may be composed of, for example, $AlO_x$, $TiO_x$, $SiO_x$, BN, SiN or SiBCN. In certain embodiments, prior to the formation of the sidewall dielectric spacer layer 404, the exposed structure can be subjected to an optional plasma pretreatment using, for example, O, H, N or $NH_3$.

Figure 5:
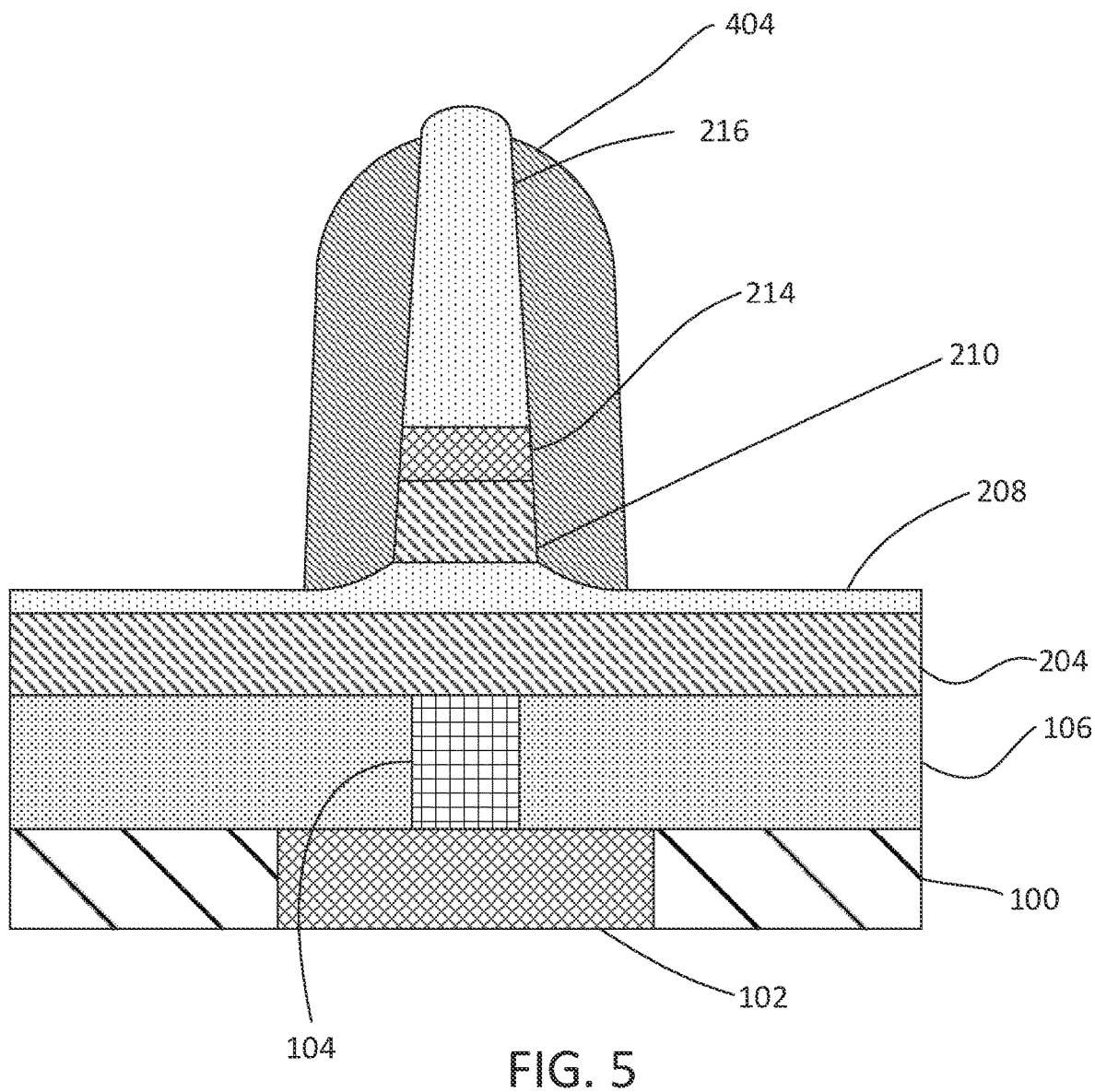
FIG. 5 depicts a cross-sectional view of the double magnetic tunnel junction device of FIG. 4 after additional fabrication operations, according to embodiments.

Referring now to FIG. 5, the sidewall dielectric spacer layer 404 is subjected to an etching process to remove a portion of the material and change the shape of this layer. In certain examples, reactive ion etching ("RIE") or high angle IBE (or a combination of both methods) may be used to remove portions of the material. As shown in FIG. 5, the etching is performed in such a way as to remove all of the material of the sidewall dielectric spacer layer 404 down to the surface of the spin conducting layer 208, while leaving portions of the sidewall dielectric spacer layer 404 to cover the sidewalls of the metallic hard mask layer 216, the etch stop layer 214, the second MTJ stack 210, and the curved portion of the spin conducting layer 208. As shown in FIG. 5, in certain embodiments the top of the metallic hard mask layer 216 is also exposed subsequent to the etching process. The remaining sidewalls of the dielectric spacer layer 404 are then used as a hardmask to pattern the first MTJ stack 204.

Figure 6:
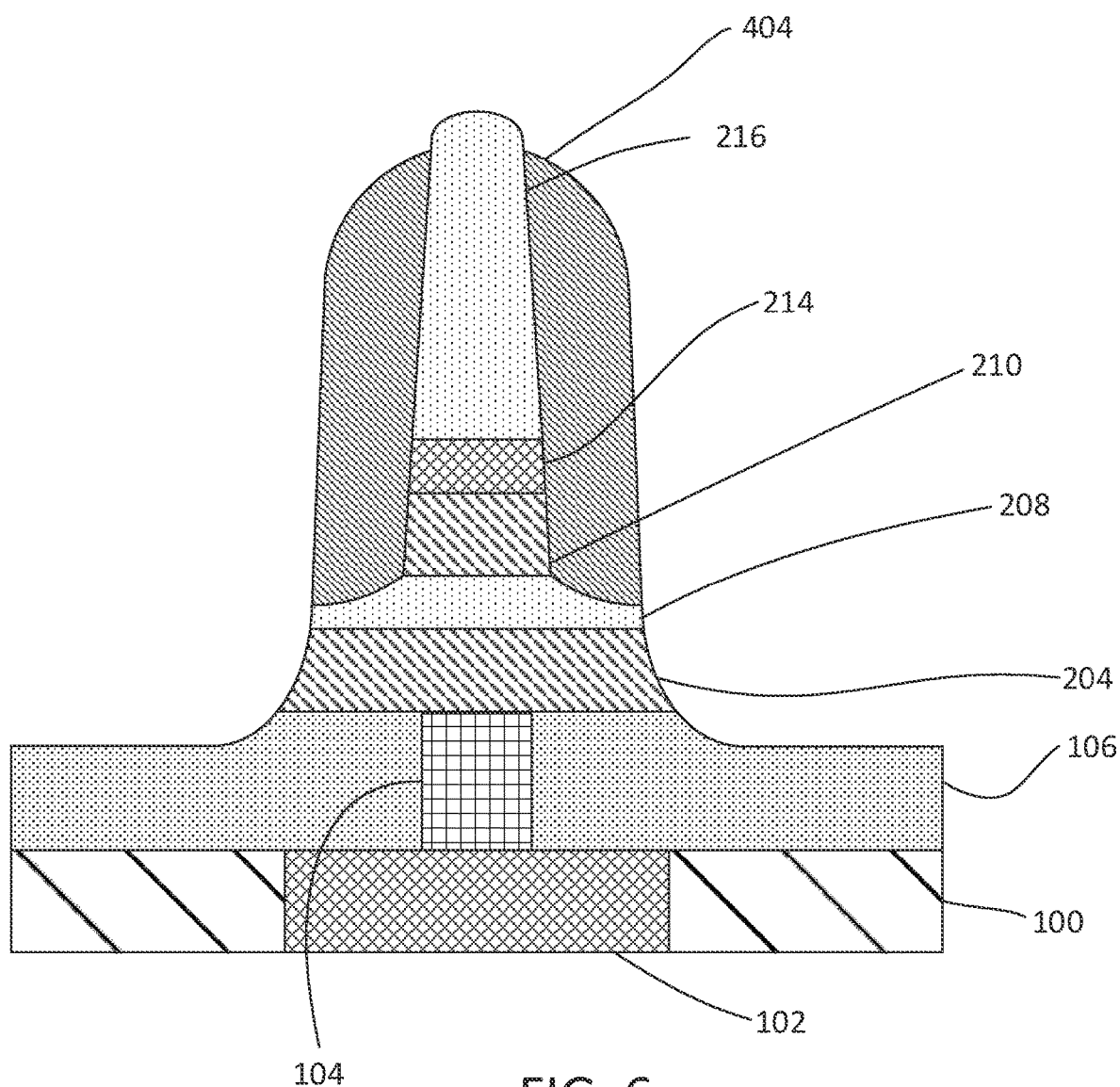
FIG. 6 depicts a cross-sectional view of the double magnetic tunnel junction device of FIG. 5 after additional fabrication operations, according to embodiments.

Referring now to FIG. 6, further patterning processing and removal of material is performed by utilizing, for example, IBE or RIE (or some combination of these methods). This etching process is stopped inside (near the top) of the via dielectric layer 106. In certain embodiments, somewhat similarly to the process described above with respect to FIG. 3, the remaining portions of the first MTJ stack 204 and the via dielectric layer 106 have somewhat of a curved cross-sectional profile. At this stage in the manufacturing process, despite removal of portions of the first MTJ stack 204, the critical dimension ("CD") of the second MTJ stack 210 is still less than that of the first MTJ stack 204. In certain embodiments, an air-break or controlled in-situ oxidation may be utilized to reduce partial electrical shorts.

Figure 7:
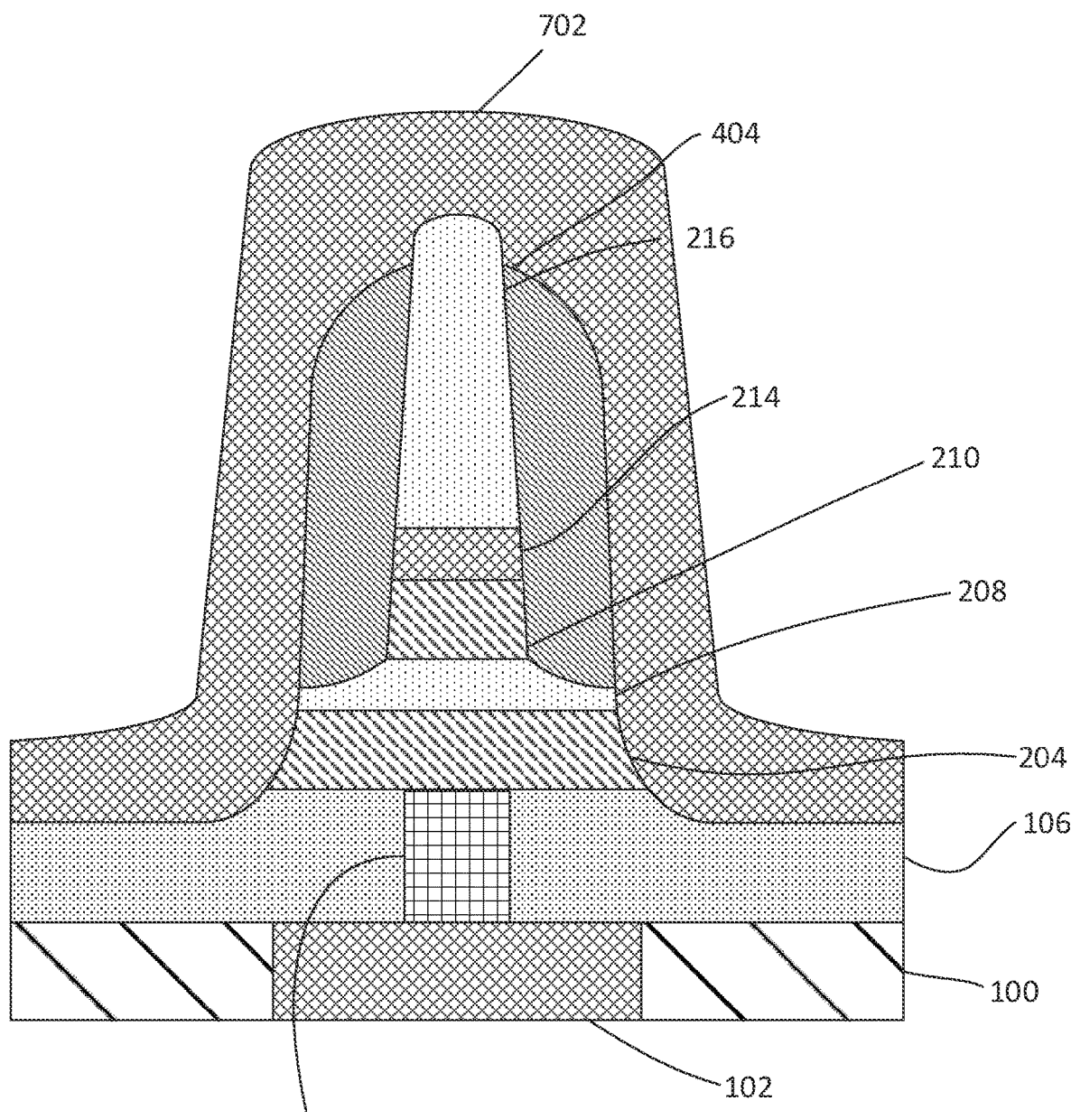
FIG. 7 depicts a cross-sectional view of the double magnetic tunnel junction device of FIG. 6 after additional fabrication operations, according to embodiments.

Referring now to FIG. 7, an encapsulation dielectric layer 702 is formed by, for example, PVD, ALD or PECVD. The encapsulation dielectric layer 702 may be composed of, for example, $AlO_x$, $TiO_x$, $SiO_x$, BN, SiN or SiBCN. The material of the encapsulation dielectric layer 702 may be the same as, or different to, the material of the spacer dielectric layer 404. In certain embodiments, prior to the formation of the encapsulation dielectric layer 702, the exposed structure can be subjected to an optional plasma pretreatment using, for example, O, H, N or $NH_3$.

Figure 8:
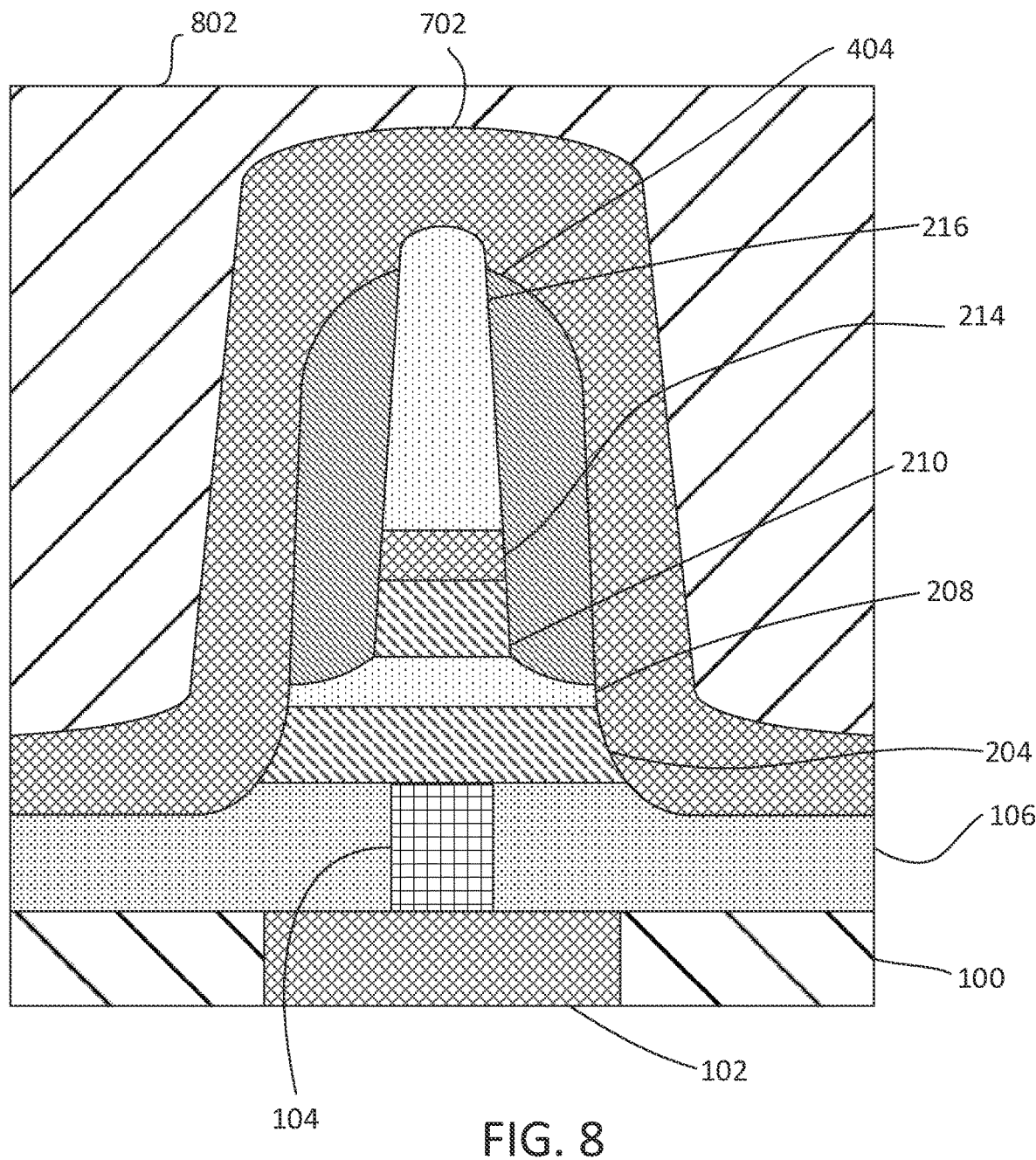
FIG. 8 depicts a cross-sectional view of the double magnetic tunnel junction device of FIG. 7 after additional fabrication operations, according to embodiments.

Referring now to FIG. 8, following formation of the encapsulation dielectric layer 702, an interlayer dielectric ("ILD") layer 802 is formed to cover the encapsulation dielectric layer 702.

Figure 9:
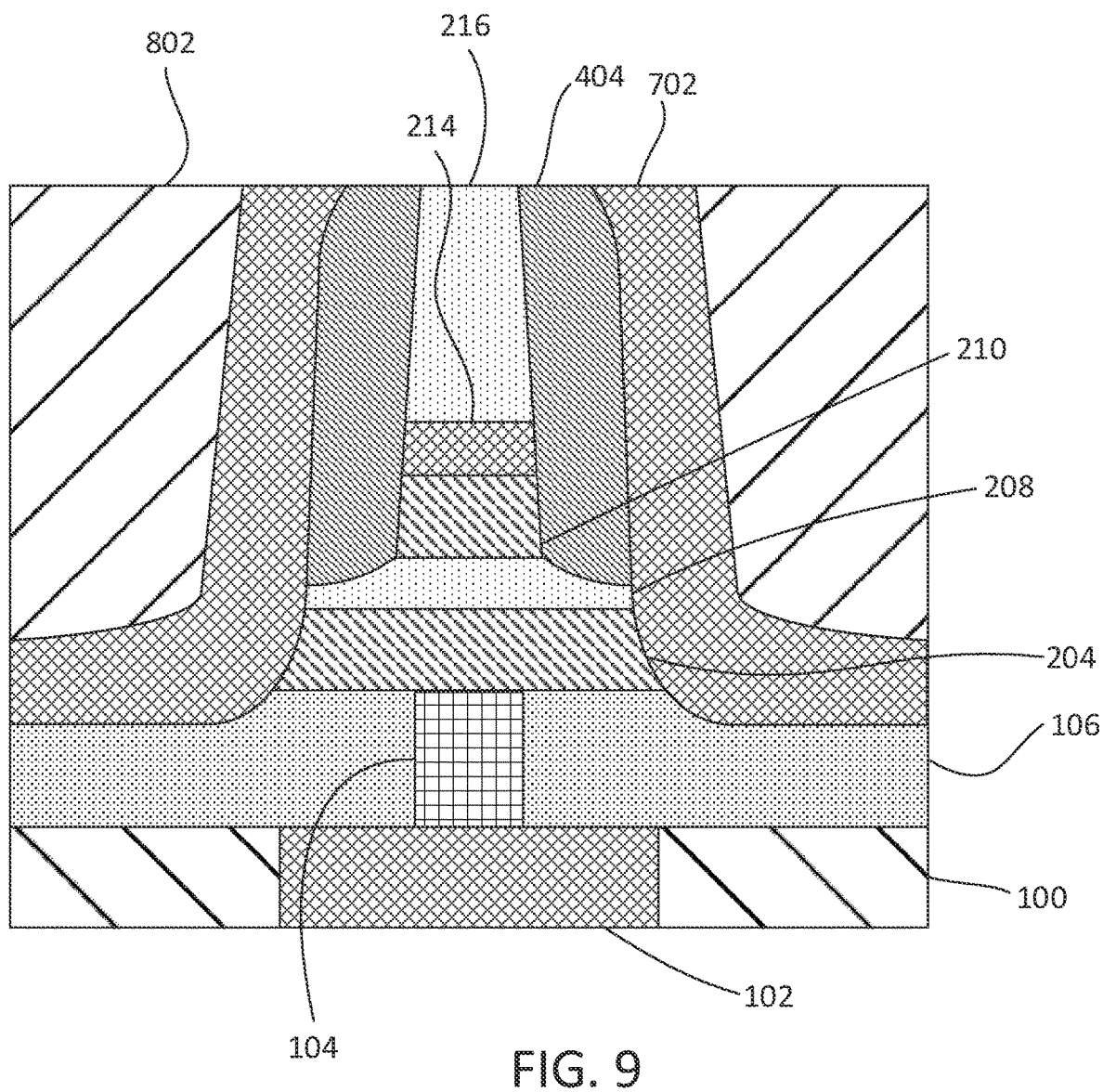
FIG. 9 depicts a cross-sectional view of the double magnetic tunnel junction device of FIG. 8 after additional fabrication operations, according to embodiments.

Referring now to FIG. 9, CMP (or the like) is performed on the DMTJ structure to planarize the surface of the structure. This CMP process exposes upper portions of the encapsulation dielectric layer 702, the metallic hardmask layer 216 and the sidewall dielectric spacer layer 404.

Figure 10:
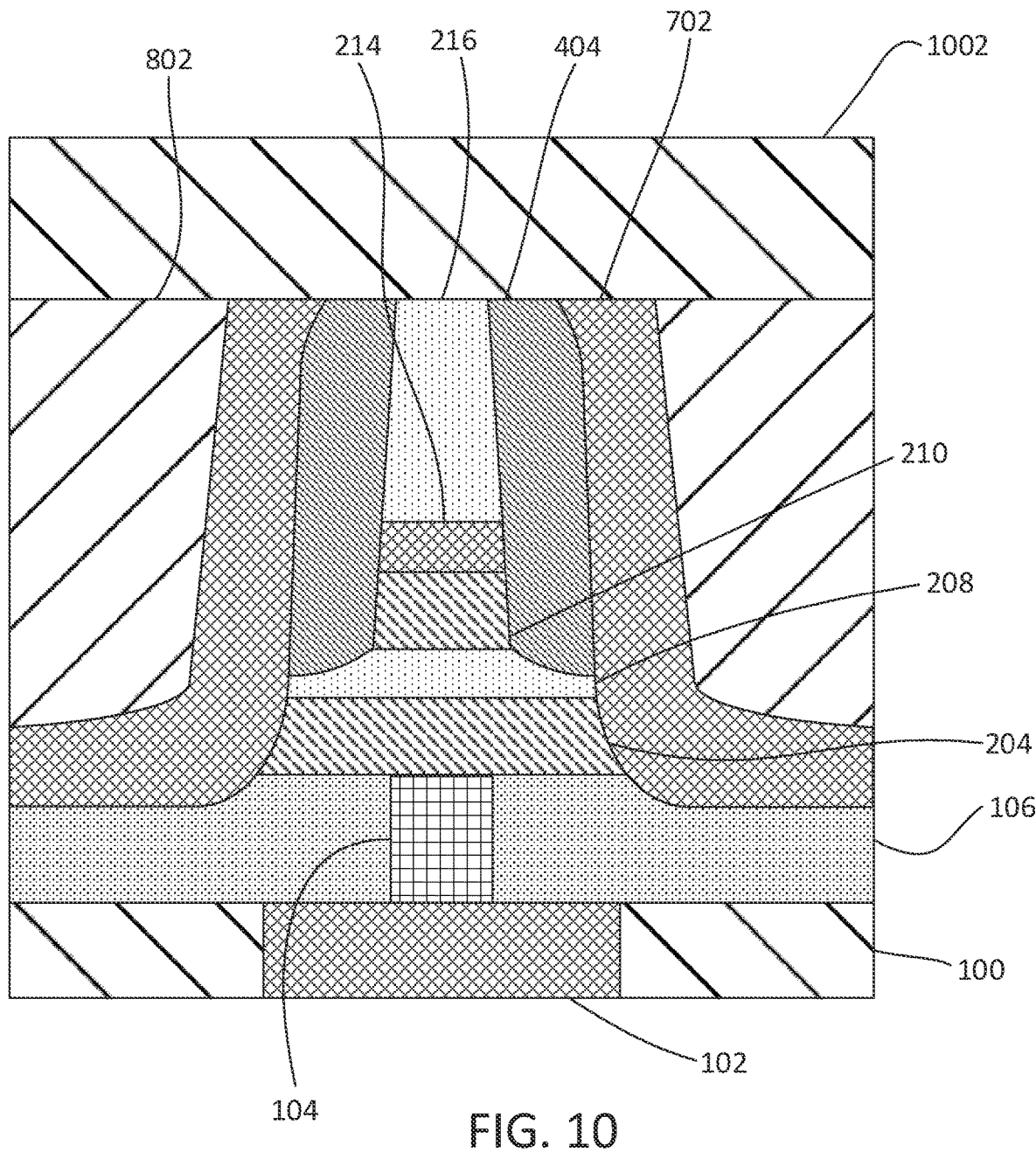
FIG. 10 depicts a cross-sectional view of the double magnetic tunnel junction device of FIG. 9 after additional fabrication operations, according to embodiments.
Figure 11:
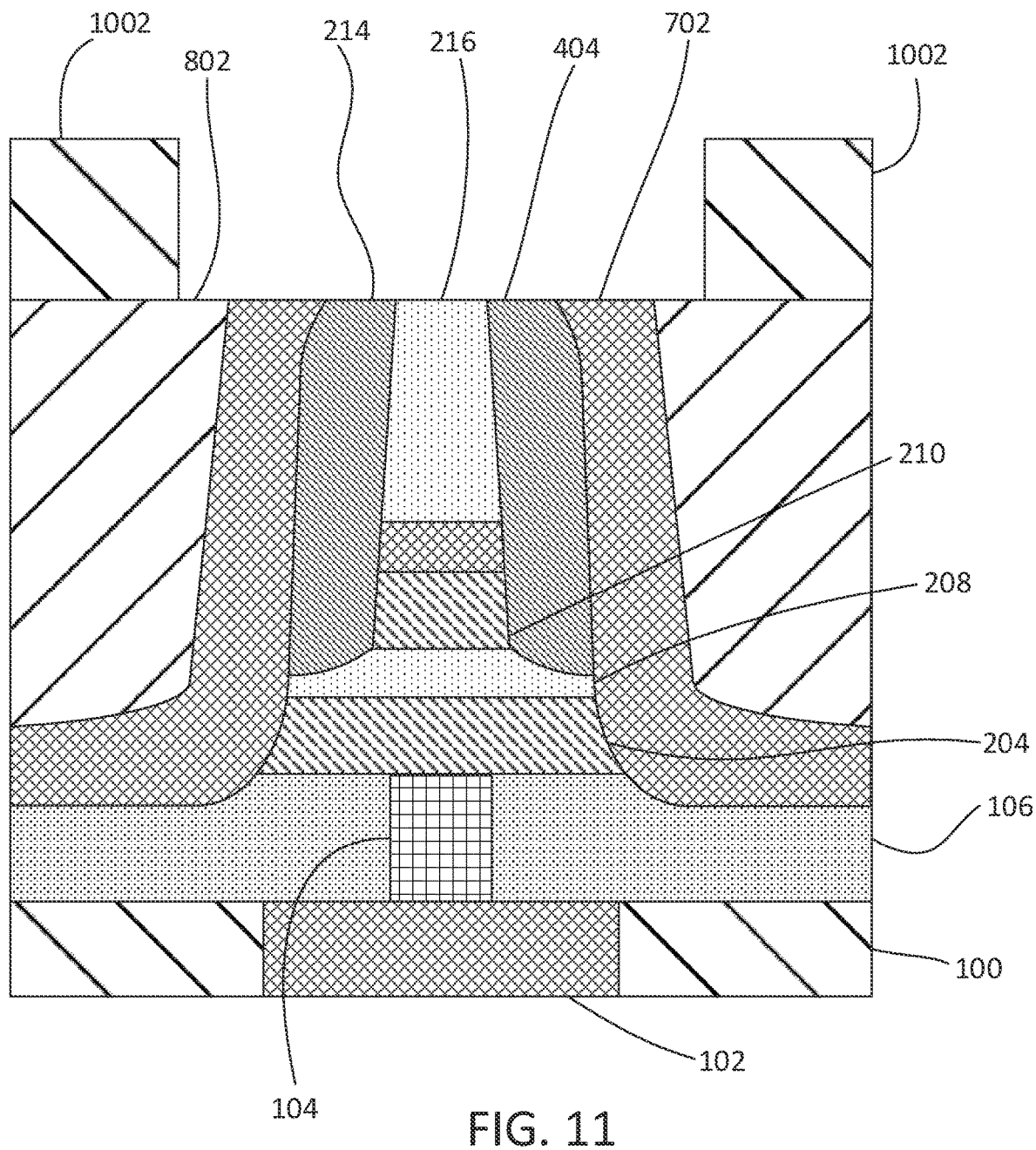
FIG. 11 depicts a cross-sectional view of the double magnetic tunnel junction device of FIG. 10 after additional fabrication operations, according to embodiments.

Referring now to FIG. 10, following the CMP planarization process, a second ILD layer 1002 is formed by lithography. Referring to FIG. 11, the second ILD layer 1002 is subject to a removal process (e.g., RIE) to remove portions of the second ILD layer 1002 to once again expose portions of the encapsulation dielectric layer 702, the metallic hardmask layer 216 and the sidewall dielectric spacer layer 404.

Figure 12:
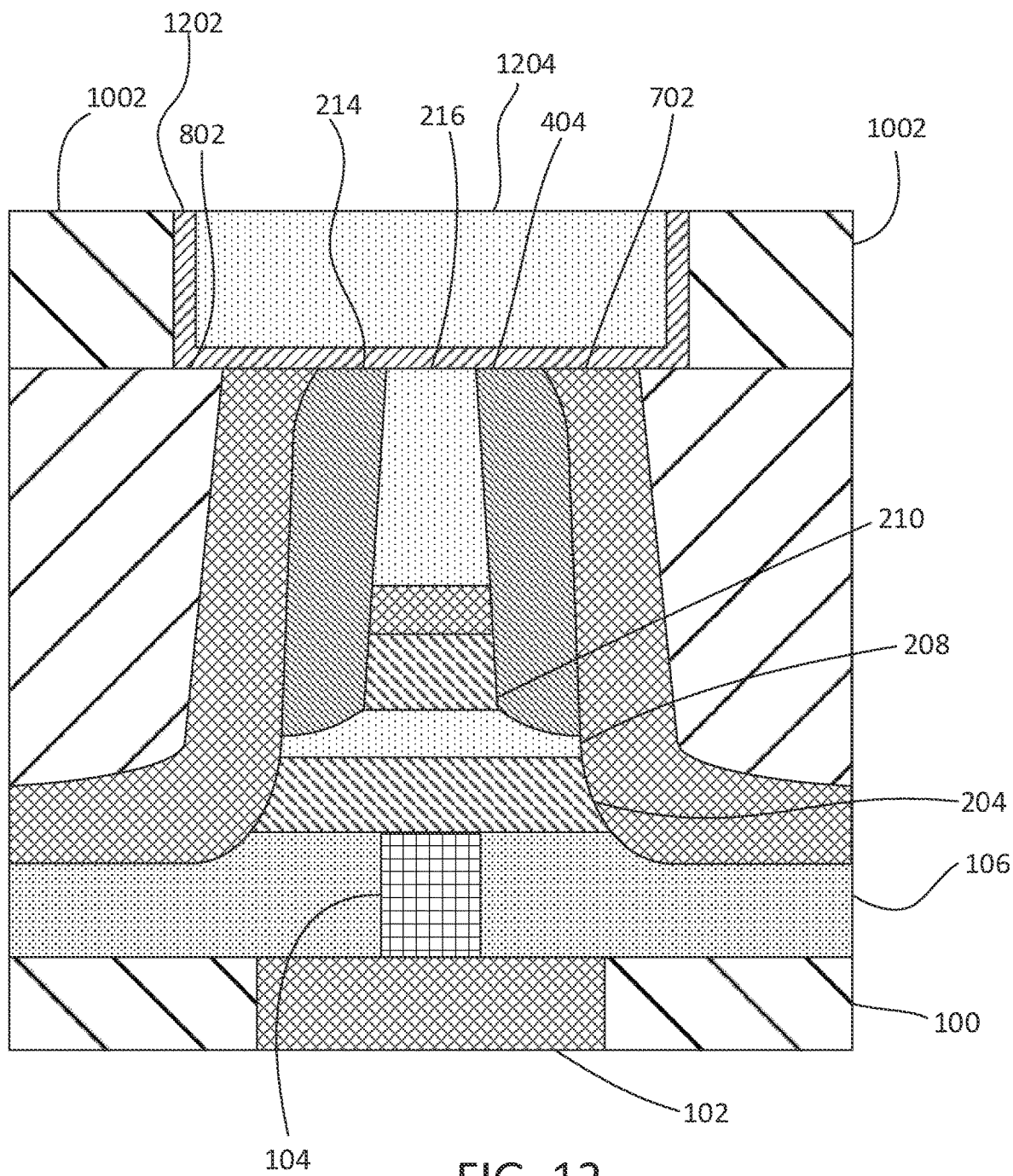
FIG. 12 depicts a cross-sectional view of the double magnetic tunnel junction device of FIG. 11 after additional fabrication operations, according to embodiments.

Referring now to FIG. 12, following the RIE process of FIG. 11, a bit line 1202 is formed, followed by a fill liner 1204. In certain embodiments, the bit-line is composed of Ta, TaN, Cu, or any suitable combination thereof.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a double magnetic tunnel junction device, the method comprising:
    forming a first magnetic tunnel junction stack;
    forming a spin conducting layer on the first magnetic tunnel junction stack; and
    forming a second magnetic tunnel junction stack on the spin conducting layer,
    wherein the second magnetic tunnel junction stack has a width that is less than a width of the first magnetic tunnel junction stack,
    wherein a width of the spin conducting layer increases in a thickness direction from a first side of the spin conducting layer adjacent to the second magnetic tunnel junction stack to a second side of the spin conducting layer adjacent to the first magnetic tunnel junction stack, and
    wherein the spin conducting layer includes a curved sidewall profile.

2. The method according to claim 1, wherein forming the first magnetic tunnel junction stack includes:
    forming a first reference layer;
    forming a first tunnel barrier layer on the first reference layer;
    forming a first magnetic free layer on the first tunnel barrier layer; and
    forming a second tunnel barrier layer on the first magnetic free layer.

3. The method according to claim 2, further comprising:
    forming an etch stop layer on the second magnetic tunnel junction stack; and
    forming a metallic hard mask layer on the etch stop layer.

4. The method according to claim 1, wherein the increasing width of the spin conducting layer is formed by etching partially through a thickness of the spin conducting layer.

5. The method according to claim 4, further comprising forming a dielectric spacer layer on surfaces of the spin conducting layer and the second magnetic tunnel junction stack,
    wherein forming the dielectric spacer layer occurs after performing the etching partially through the spin conducting layer, and wherein the dielectric spacer layer covers a portion of the underlying spin conducting layer.

6. The method according to claim 5, further comprising etching through portions of the spin conducting layer and the first magnetic tunnel junction stack that are not covered by the dielectric spacer layer.

7. The method according to claim 1, wherein a width of a top surface of the spin conducting layer is the same as a width of a bottom surface of the second magnetic tunnel junction stack, and wherein a width of a bottom surface of the spin conducting layer is the same as a width of a top surface of the first magnetic tunnel junction stack.

8. The method according to claim 1, wherein the first magnetic tunnel junction stack is formed by a self-aligned patterning process.

9. The method according to claim 1, wherein the spin conducting layer has a lower portion and an upper portion, and the lower portion has a sidewall profile that is more vertical than a sidewall profile of the upper portion.

10. The method according to claim 1, wherein the second magnetic tunnel junction has a sidewall profile that is more vertical than a sidewall profile of the spin conducting layer.

11. A double magnetic tunnel junction device comprising:
a first magnetic tunnel junction stack;
a spin conducting layer formed on the first magnetic tunnel junction stack; and
a second magnetic tunnel junction stack formed on the spin conducting layer;
wherein the second magnetic tunnel junction stack has a width that is less than a width of the first magnetic tunnel junction stack, and
wherein a width of the spin conducting layer increases in a thickness direction from a first side of the spin conducting layer adjacent to the second magnetic tunnel junction stack to a second side of the spin conducting layer adjacent to the first magnetic tunnel junction stack, and
wherein the spin conducting layer includes a curved sidewall profile.

12. The double magnetic tunnel junction device according to claim 11, wherein the first magnetic tunnel junction stack includes:
a first reference layer;
a first tunnel barrier layer on the first reference layer;
a first magnetic free layer on the first tunnel barrier layer; and
a second tunnel barrier layer on the first magnetic free layer.

13. The double magnetic tunnel junction device according to claim 12, further comprising:
an etch stop layer on the second magnetic tunnel junction stack; and
a metallic hard mask layer on the etch stop layer.

14. The double magnetic tunnel junction device according to claim 11, wherein a width of a top surface of the spin conducting layer is the same as a width of a bottom surface of the second magnetic tunnel junction stack, and wherein a width of a bottom surface of the spin conducting layer is the same as a width of a top surface of the first magnetic tunnel junction stack.

15. The double magnetic tunnel junction device according to claim 11, wherein the first magnetic tunnel junction stack is formed by a self-aligned patterning process.

16. The double magnetic tunnel junction device according to claim 11, further comprising:
a dielectric spacer layer formed on surfaces of the spin conducting layer and the second magnetic tunnel junction stack; and
an encapsulating dielectric layer formed on side surfaces of the dielectric spacer layer, and on side surfaces of the first magnetic tunnel junction stack.

17. The double magnetic tunnel junction device according to claim 16, further comprising an interlayer dielectric formed on the encapsulating dielectric layer.

18. The double magnetic tunnel junction device according to claim 17, wherein the first magnetic tunnel junction stack is formed on a via dielectric layer, and the encapsulating dielectric layer extends below a top surface of the via dielectric layer.

19. The double magnetic tunnel junction device according to claim 11, wherein the spin conducting layer is non-magnetic, and comprises at least one material selected from the group consisting of Cu, CuN, Ag and AgSn.

20. The double magnetic tunnel junction device according to claim 11, wherein the second magnetic tunnel junction has a sidewall profile that is more vertical than a sidewall profile of the spin conducting layer.

* * * * *